United States Patent
Liang et al.

(10) Patent No.: US 7,217,643 B2
(45) Date of Patent: May 15, 2007

(54) SEMICONDUCTOR STRUCTURES AND METHODS FOR FABRICATING SEMICONDUCTOR STRUCTURES COMPRISING HIGH DIELECTRIC CONSTANT STACKED STRUCTURES

(75) Inventors: Yong Liang, Gilbert, AZ (US); Hao Li, Chandler, AZ (US)

(73) Assignee: Freescale Semiconductors, Inc., Austin, TX (US)

( * ) Notice: Subject to any disclaimer, the term of this patent is extended or adjusted under 35 U.S.C. 154(b) by 137 days.

(21) Appl. No.: 11/066,887

(22) Filed: Feb. 24, 2005

(65) Prior Publication Data

US 2006/0197227 A1    Sep. 7, 2006

(51) Int. Cl.
    *H01L 21/3205* (2006.01)
(52) U.S. Cl. .................... 438/591; 438/287; 438/785
(58) Field of Classification Search ............... 438/585, 438/590, 591, 287, 778, 779, 785; 257/410, 257/411
    See application file for complete search history.

(56) References Cited

U.S. PATENT DOCUMENTS

| | | | |
|---|---|---|---|
| 6,392,257 B1 * | 5/2002 | Ramdani et al. | 257/190 |
| 6,407,435 B1 | 6/2002 | Ma et al. | |
| 6,562,491 B1 * | 5/2003 | Jeon | 428/697 |
| 6,627,503 B2 | 9/2003 | Ma et al. | |
| 6,791,125 B2 * | 9/2004 | Demkov et al. | 257/192 |
| 6,825,506 B2 * | 11/2004 | Chau et al. | 257/192 |
| 7,045,815 B2 * | 5/2006 | Yu et al. | 257/43 |
| 7,078,785 B2 * | 7/2006 | Ciancio et al. | 257/532 |
| 2005/0142715 A1 * | 6/2005 | Sakoda et al. | 438/197 |
| 2005/0186687 A1 * | 8/2005 | Lee et al. | 438/3 |

OTHER PUBLICATIONS

Ushakov et al., "Effect of La and Y on Crystallization Temperatures of Hafnia and Zirconia," J. Mater. Res., vol. 19, No. 3, Mar. 2004. pp. 693-696.

Jensen et al., "X-ray Reflectivity Characterization of $ZnO/Al_2O_3$ Multilayers Prepared by Atomic Layer Deposition," Chem. Mater. 2002, 14, pp. 2276-2282.

* cited by examiner

*Primary Examiner*—Kevin M. Picardat
(74) *Attorney, Agent, or Firm*—Ingrassia Fisher & Lorenz

(57) ABSTRACT

Semiconductor structures, and methods for fabricating semiconductor structures, comprising high dielectric constant stacked structures are provided. A stacked dielectric structure (16) in accordance with one exemplary embodiment of the present invention has a first amorphous dielectric layer (18) comprising $Hf_xZr_{1-x}O_2$, where $0 \leq X \leq 1$. An amorphous interlayer (20) overlies the first amorphous dielectric layer. The interlayer has a net dielectric constant that is approximately no less than the dielectric constant of $HfZrO_4$. A second amorphous dielectric layer (22) overlies the interlayer. The second amorphous dielectric layer comprises $Hf_yZr_{1-y}O_2$, where $0 \leq Y \leq 1$. The stacked dielectric structure (16) has a net dielectric constant that is approximately no less than the dielectric constant of $HfZrO_4$.

13 Claims, 3 Drawing Sheets

SEMICONDUCTOR STRUCTURES AND METHODS FOR FABRICATING SEMICONDUCTOR STRUCTURES COMPRISING HIGH DIELECTRIC CONSTANT STACKED STRUCTURES

FIELD OF THE INVENTION

The present invention generally relates to semiconductor structures and to methods for their fabrication, and more particularly relates to semiconductor structures and methods for forming semiconductor structures comprising stacked layers having high dielectric constants.

BACKGROUND OF THE INVENTION

As future generations of electronic devices advance in complexity and decrease in size, a growing need exists for a dielectric material more effective than $SiO_2$. Increased demands on ultra-large scale integrated (ULSI) circuits have required that the $SiO_2$ that forms the gate oxide of field-effect transistors be made laterally smaller and, consequently, thinner. Eventually, however, the $SiO_2$ layers will be required to be so small and thin that electron tunneling will make current leakage unacceptably high for low-power devices.

Hafnium oxide ($HfO_2$), also known as hafnia, has been identified as a promising candidate to replace $SiO_2$ as a gate dielectric. Hafnium oxide, having a relatively high bulk dielectric constant (k=15–25), would allow gate oxides to be physically thicker (for a given capacitance), which could significantly reduce tunneling. Hafnium oxide also exhibits a large band gap (approximately 5.7 eV) and a band offset (greater than 1 eV) with substrates such as silicon. Further, the diffusion of hafnium atoms into substrates such as silicon, particularly during or after post-deposition anneals, has proven to be negligible.

However, when sufficiently thick, an amorphous hafnium oxide film tends to crystallize at relatively low temperatures (approximately 400° C.) to form monoclinic, cubic, and/or tetragonal crystallites. Polycrystalline hafnium oxide facilitates unwanted metal or impurity diffusion through grain boundaries and degrades gate stack performance. Polycrystalline hafnium oxide also causes higher leakage current because of charge transport through grain boundaries. Further, the surface of polycrystalline hafnium oxide may have grains with different terminations associated with different surface potentials due to different dipole strength and orientation of the terminations. Such varied surface potentials could be detrimental to device yield if the variation of the surface potential is sufficiently large and the grain sizes are comparable to gate dimensions.

Accordingly, it is desirable to provide a semiconductor structure and a method for fabricating a semiconductor structure without the undesirable drawbacks described above. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
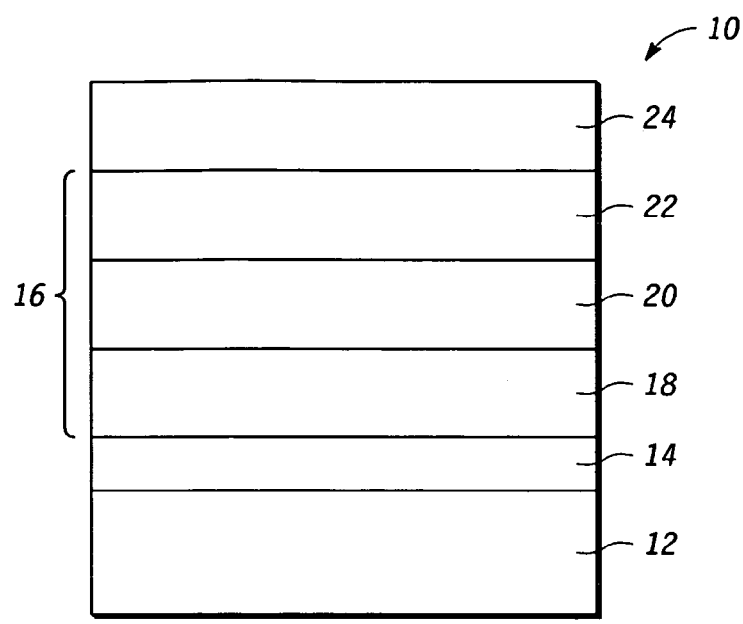
FIG. 1 is a cross-sectional view of a semiconductor structure in accordance with an exemplary embodiment of the present invention.
Figure 7:
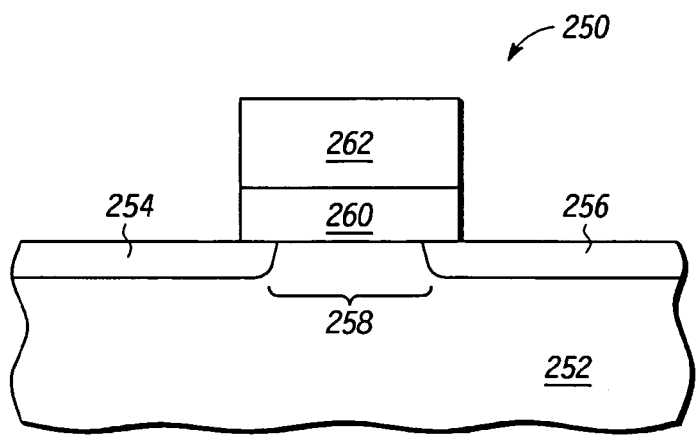
FIG. 7 is a cross-sectional view of a conventional field effect transistor.

FIG. 1 illustrates schematically, in cross section, a portion of a semiconductor structure 10 in accordance with an exemplary embodiment of the present invention. Semiconductor structure 10 may be, for example, a portion of a MOS or CMOS field effect transistor or may comprise any other suitable circuit comprising a dielectric material. For purposes of example, FIG. 7 illustrates a conventional MOS field effect transistor 250. Transistor 250 is formed on a substrate 252 and comprises a source region 254, a drain region 256, and a channel region 258 overlying which is a dielectric structure 260. An electrode 262 is formed overlying dielectric structure 260.

As stated above, semiconductor structure 10 may be a portion of a field effect transistor, as illustrated in FIG. 1, where, for purposes of simplicity, the source and drain regions are not shown. Alternatively, semiconductor structure 10 may comprise any other suitable circuit. Semiconductor structure 10 comprises a substrate 12, such as substrate 252 of FIG. 7, which may comprise any suitable semiconductor, compound semiconductor, or metal. The substrate can be of, for example, a material from Group IV of the Periodic Table. Examples of Group IV semiconductor materials include silicon, germanium, mixed silicon and germanium, mixed silicon and carbon, and the like. Substrate 12 also may comprise other substrates commonly used in the semiconductor industry, such as, for example, gallium arsenide. Substrate 12 also may comprise a metal, such as platinum, molybdenum, copper or aluminum, as required for a particular device application, such as a metal-insulator-metal application. In a preferred embodiment of the invention, substrate 12 comprises silicon.

In one embodiment of the invention, semiconductor structure 10 also may comprise an amorphous oxide layer 14 overlying substrate 12. In a preferred embodiment of the invention, oxide layer 14 comprises a silicon oxide $SiO_x$, where X is any number greater than zero. The oxide layer 14 may have any suitable thickness that does not adversely affect the dielectric constant of an overlying amorphous dielectric structure 16, discussed in more detail below. Preferably, oxide layer 14 has a thickness in the range of about 0.5 nanometers to about 1 nanometer. Oxide layer 14 serves as a barrier to diffusion of materials into substrate 12, forms a superior interface with substrate 12, and provides an amorphous foundation upon which dielectric structure 16 may be formed.

As described above, semiconductor structure 10 further comprises amorphous dielectric stacked structure 16 overlying substrate 12. Dielectric structure 16 may comprise, for example, the gate oxide of a MOS or CMOS field effect transistor, such as dielectric structure 260 of FIG. 7. Dielectric structure 16 is formed of a first amorphous dielectric layer 18, an amorphous interlayer 20, and a second amorphous dielectric layer 22. Dielectric structure 16 may have any thickness suitable for minimizing or eliminating tunneling through dielectric structure 16. Preferably, dielectric structure 16 has a thickness in the range of about 1 nanometer to about 10 nanometers, and, more preferably, has a thickness in the range of about 3 to about 4 nanometers. In one embodiment of the invention, semiconductor structure 10 also may comprise an electrode 24, such as electrode 262 of FIG. 7, that is disposed overlying amorphous dielectric structure 16.

First amorphous dielectric layer 18 may comprise amorphous $HfO_2$, zirconium oxide ($ZrO_2$), or an alloy having the formula $Hf_X Zr_{1-X} O_2$, where $0 \leq X \leq 1$, and has a dielectric constant $k_1$ that is approximately no less than the dielectric constant of $HfZrO_4$. In a preferred embodiment of the invention, first amorphous dielectric layer 18 comprises $HfO_2$.

Second amorphous dielectric layer 22 may comprise amorphous $HfO_2$, $ZrO_2$, or an alloy material having the formula $Hf_Y Zr_{1-Y} O_2$, where $0 \leq Y \leq 1$, and also has a dielectric constant $k_2$ that is approximately no less than the dielectric constant of $HfZrO_4$. In one embodiment of the invention, first and second amorphous dielectric layers 18 and 22 are formed of different materials, that is, X does not equal Y and/or $k_1$ does not equal $k_2$. In another embodiment of the invention, first and second amorphous dielectric layers 18 and 22 are formed of the same materials, that is, X is approximately equal to Y and $k_1$ is approximately equal to $k_2$. In a preferred embodiment of the invention, first amorphous dielectric layer 18 and second amorphous dielectric layer 22 comprise $HfO_2$. Amorphous dielectric layers 18 and 22 each have a thickness that is less than a thickness at which polycrystalline phases may form.

Interlayer 20 may comprise any amorphous dielectric material or combination of materials that has a chemical composition that is different from first and/or second dielectric layers 18 and 22 and that results in interlayer 20 having a net dielectric constant $k_3$ that is approximately no less than the dielectric constant of $HfZrO_4$. Materials suitable for forming interlayer 20 include, but are not limited to, lanthanum aluminum oxide ($La_X Al_Y O_3$), lanthanum scandium oxide ($La_X Sc_Y O_3$), lanthanum lutetium oxide ($La_X Lu_Y O_3$), strontium titanate ($Sr_X Ti_Y O_3$), barium titanate ($Ba_X Ti_Y O_3$), strontium barium titanate ($Sr_X Ba_Y Ti_Z O_3$), barium zirconium oxide ($Ba_X Zr_Y O_3$), strontium zirconium oxide ($Sr_X Zr_Y O_3$), and tantalum oxide ($Ta_2 O_5$), where X, Y and Z are any numbers greater than zero. Interlayer 20 may comprise one continuous layer or may comprise multiple sublayers. Interlayer 20 has a thickness that is less than a thickness at which polycrystalline phases may form.

The use of an interlayer 20 interposed between first and second amorphous dielectric layers 18 and 22 permits the stacked dielectric structure 16 to have a thickness that minimizes or eliminates tunneling through dielectric structure 16 while also preventing or minimizing the formation of polycrystalline phases within dielectric structure 16. In addition, the use of the thin amorphous layers in the stacked structure results in an increase the crystallization onset temperature of the entire dielectric stack 16, thus improving the stability and uniformity of the amorphous dielectric stack 16 during subsequent anneal processes. Further, the use of an interlayer 20 having a dielectric constant $k_3$ of about no less than the dielectric constant of $HfZrO_4$ maintains an overall dielectric constant $k_{TOTAL}$ of dielectric stack 16 at about the dielectric constant of $HfZrO_4$ or may even increase the dielectric constant of the dielectric stack 16 above the dielectric constant of $HfZrO_4$. For example, interlayer 20 may comprise $BaSrTiO_3$, which has a dielectric constant of approximately 300. When disposed between amorphous dielectric layers 18 and 22 that are formed of $HfO_2$, the $BaSrTiO_3$ interlayer 20 serves to increase the dielectric constant $k_{TOTAL}$ of dielectric stack 16 above that of $HfO_2$. In addition to modifying the crystallization temperature and the dielectric constant, the presence of an interlayer, such as layer 20 in FIG. 1, also may modify oxygen transport behavior of the overall dielectric stack and subsequently allow for better control of the thickness of the interfacial $SiO_x$ layer 14 during subsequent material/device processing steps.

Figure 2:
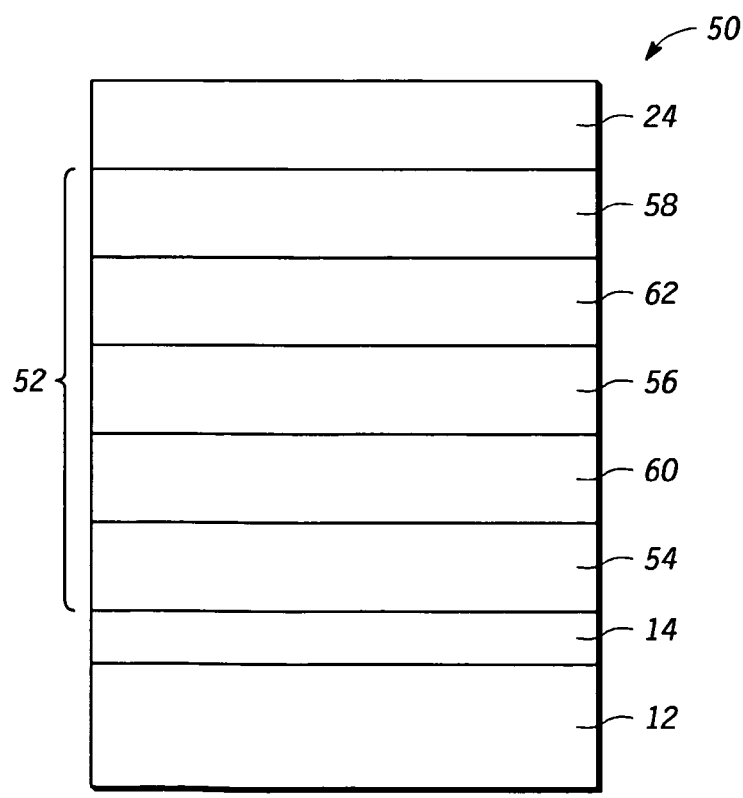
FIG. 2 is a cross-sectional view of a semiconductor structure in accordance with another exemplary embodiment of the present invention.

It will be appreciated that a semiconductor structure in accordance with another embodiment of the present invention may comprise multiple interlayers disposed between amorphous dielectric layers. Referring to FIG. 2, a semiconductor structure 50 may comprise a substrate 12 and an oxide layer 14, such as substrate 12 and oxide layer 14 described above with reference to FIG. 1. Semiconductor structure 50 may also be capped with an electrode 24, such as electrode 24 described above with reference to FIG. 1. Semiconductor structure 50 further may comprise an amorphous dielectric stacked structure 52 overlying oxide layer 14. Dielectric structure 52 may comprise, for example, the gate oxide of a MOS or CMOS field effect transistor, such as dielectric structure 260 of FIG. 7. Dielectric structure 52 is formed of a first amorphous dielectric layer 54, a second amorphous dielectric layer 56, and a third amorphous dielectric layer 58. First amorphous dielectric layer 54, second amorphous dielectric layer 56, and third amorphous dielectric layer 58 each may be formed of any of the materials used to form first and/or second dielectric layers 18 and 22 described above and may be formed of the same or different materials. Dielectric structure 52 further comprises a first interlayer 60 interposed between first and second amorphous dielectric layers 54 and 56 and a second interlayer 62 interposed between second and third amorphous dielectric layers 56 and 58. First interlayer 60 and second interlayer 62 each may be formed of any of the materials used to form interlayer 20 described above and may be formed of the same or different materials. Dielectric structure 52 may have any thickness suitable to reduce or minimize tunneling through dielectric structure 52. Preferably, dielectric structure 52 has a thickness in the range of about 1 nanometer to about 10 nanometers and, more preferably, has a thickness in the range of about 3 to about 4 nanometers. It will be appreciated that, while FIG. 1 illustrates a stacked dielectric structure 16 comprised of three layers and FIG. 2 illustrates a stacked dielectric structure 52 comprised of five layers, the stacked dielectric layer of the present invention may comprise any number of amorphous dielectric layers and any number of interlayers suitable for fabricating an amorphous dielectric stacked structure having a desired thickness, a desired crystallization onset temperature, and/or a desired dielectric constant.

Figure 3:
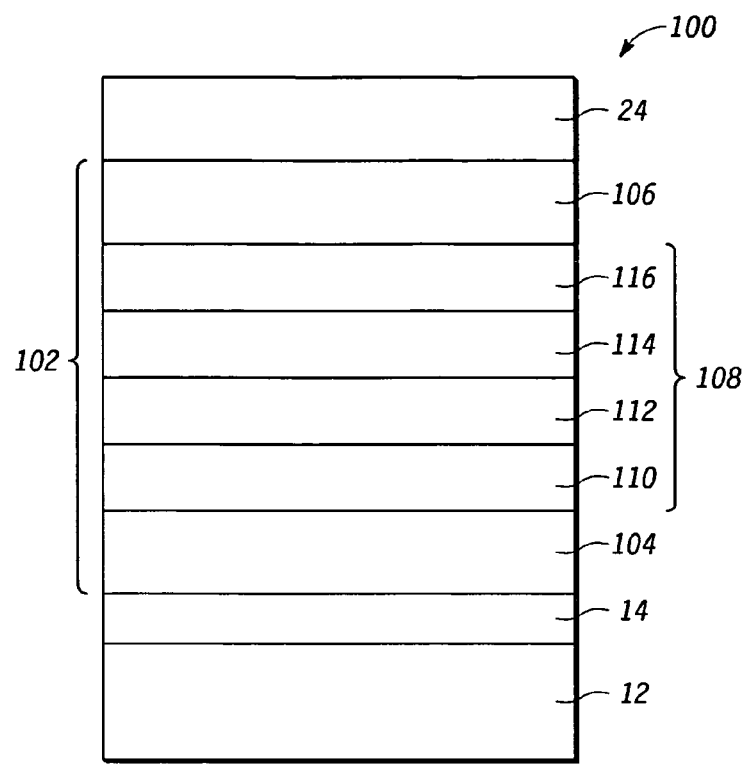
FIG. 3 is a cross-sectional view of a semiconductor structure in accordance with a further exemplary embodiment of the present invention.

In accordance with another embodiment of the present invention, interlayer 20 may comprise multiple sublayers, which, when stacked to form interlayer 20, result in a net dielectric constant $k_3$ of interlayer 20 that is approximately no less than the dielectric constant of $HfZrO_4$. Referring to FIG. 3, a semiconductor structure 100 may comprise a substrate 12 and an oxide layer 14, such as substrate 12 and oxide layer 14 described above with reference to FIG. 1. Semiconductor structure 100 also may be capped with an electrode 24, such as electrode 24 described above with reference to FIG. 1. Semiconductor structure 100 further comprises an amorphous dielectric stacked structure 102 overlying oxide layer 14. Dielectric structure 102 comprises a first amorphous dielectric layer 104 and a second amorphous dielectric layer 106. First amorphous dielectric layer 104 and second amorphous dielectric layer 106 each may be formed of any of the materials used to form first and/or second dielectric layers 18 and 22 described above and may be formed of the same or different materials. Dielectric structure 102 may have any thickness suitable for minimizing or eliminating tunneling through dielectric structure 102. Preferably, dielectric structure 102 has a thickness in the range of about 1 nanometer to about 10 nanometers and, more preferably, has a thickness in the range of about 3 to about 4 nanometers.

Dielectric structure 102 further comprises an interlayer 108 interposed between first and second amorphous dielectric layers 104 and 106. Interlayer 108 is formed of two or more sublayers that may have the same or different compositions and may have the same or different thicknesses. For example, interlayer 108 is illustrated in FIG. 3 with four sublayers 110, 112, 114, and 116. Sublayers 110 and 114 may comprise $LaO_X$ and sublayers 112 and 116 may comprise $AlO_Y$, where X and Y are greater than zero. In this regard, sublayers 110, 112, 114, and 116 form an interlayer 108 having a net chemical composition $La_XAl_YO$ with a net dielectric constant $k_3$ that is approximately no less than the dielectric constant of $HfZrO_4$. In another example, sublayers 110 and 114 may comprise $BaTiO_3$ and sublayers 112 and 116 may comprise $SrTiO_3$. In this regard, sublayers 110, 112, 114, and 116 form an interlayer 108 having a net chemical composition $Sr_{1-X}Ba_XTiO_3$ ($0 \leq X \leq 1$) with a net dielectric constant $k_3$ that is approximately no less than the dielectric constant of $HfZrO_4$. It will be appreciated that, while FIG. 3 illustrates interlayer 108 with four sublayers, interlayer 108 may comprise any suitable number of sublayers comprised of any suitable dielectric material(s) such that the overall chemical composition of interlayer 108 results in a net dielectric constant $k_3$ that is approximately no less than the dielectric constant of $HfZrO_4$.

In another exemplary embodiment of the present invention, the interlayer may be "graded" that is, the chemical composition of the interlayer proximate to a first amorphous dielectric material layer is different from the chemical composition of the interlayer proximate to a second amorphous dielectric material layer, to create a dipole within the interlayer. In this regard, the dipole may be used to modify the band alignment of the overall semiconductor structure and, hence, the electrode work function of the semiconductor structure. For example, referring again to FIG. 3, sublayers 110 and 114 may comprise $LaO_X$ and sublayers 112 and 116 may comprise $AlO_Y$, where X and Y are greater than zero. In addition, sublayer 110 may have a thickness that is different from the thicknesses of layers 112, 114, and 116 to create a dipole within interlayer 108. For example, sublayer 110 may have thickness of about 0.4 nanometers and sublayers 112, 114, and 116 each may have a thickness of about 0.2 nanometers. In this regard, sublayers 110, 112, 114, and 116 form an interlayer 108 having a net chemical composition $La_XAl_YO$ with a net dipole that modifies the band alignment, and hence work function of the electrode 24 with respective to substrate 12, of the semiconductor structure 100.

Figure 4:
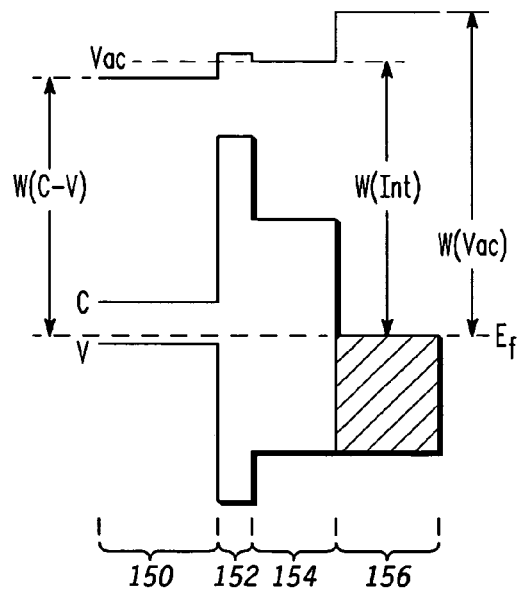
FIG. 4 is a graphical representation of an energy band alignment of a semiconductor structure having a silicon substrate, a silicon oxide layer overlying the substrate, a hafnium oxide layer overlying the silicon oxide layer, and a metal layer overlying the hafnium oxide layer.
Figure 5:
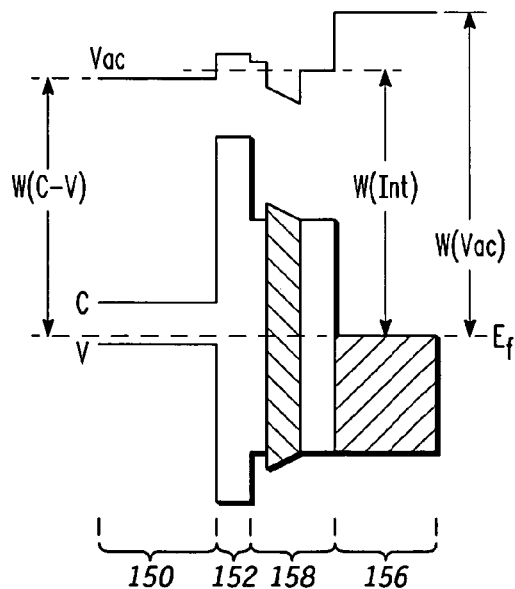
FIG. 5 is a graphical representation of an energy band alignment of a semiconductor structure having a silicon substrate, a silicon oxide layer overlying the substrate, a graded dielectric structure overlying the silicon oxide layer, and a metal layer overlying the hafnium oxide layer.

FIG. 4 illustrates an energy band alignment of a semiconductor structure comprising a hafnium oxide layer disposed between a silicon oxide layer and an electrode of a gate structure of a MOS or CMOS transistor. In FIG. 4, $E_f$ is the Fermi level, V represents the valence band, C represents the conduction band, Vac represents the vacuum level, W(C-V) represents the work function of electrode with respect to the substrate, W(Int) is the work function of the electrode with respect to the adjacent dielectric layer, and W(Vac) is the vacuum work function of the metal electrode. Area 150 represents a band structure of a p-silicon substrate, area 152 represents a band structure of a silicon dioxide layer overlying the silicon substrate, area 154 represents a band structure of a hafnium oxide layer overlying the silicone dioxide layer, and area 156 represents a band structure of a metal electrode overlying the hafnium oxide layer. In contrast, FIG. 5 illustrates an energy band alignment of a semiconductor structure comprising a dielectric structure of the present invention, such as, for example, dielectric structure 16 of FIG. 1, dielectric structure 52 of FIG. 2, or dielectric structure 102 of FIG. 3. As in FIG. 4, area 150 represents a band structure of a p-silicon substrate, area 152 represents a band structure of a silicon dioxide layer overlying the silicon substrate, and area 156 represents a band structure of a metal electrode. Area 158 illustrates a band structure of a graded dielectric structure, such as that described above. As is evident by comparing FIGS. 4 and 5, the band alignment of the semiconductor structure has been modified and the work function has been adjusted by use of a graded dielectric structure.

In another exemplary embodiment, the dielectric stacked structure may comprise a "graded" interlayer comprising a layer of material within which the chemical composition changes. For example, referring again to FIG. 1, interlayer 20 may comprise a layer of material having a composition that is graded such that the chemical composition of the layer proximate to amorphous dielectric layer 18 is different from the chemical composition of layer proximate to amorphous dielectric layer 22. Interlayer 20 may comprise a layer of $La_XAl_YO_3$, $La_XSc_YO_3$, $La_XLu_YO_3$, $Sr_XTi_YO_3$, $Ba_XTi_YO_3$, $Sr_XBa_YTiO_3$, $Ba_XZr_YO_3$, or $Sr_XZr_YO_3$, where X and/or Y increases or decreases throughout the layer or portions of the layer.

Figure 6:
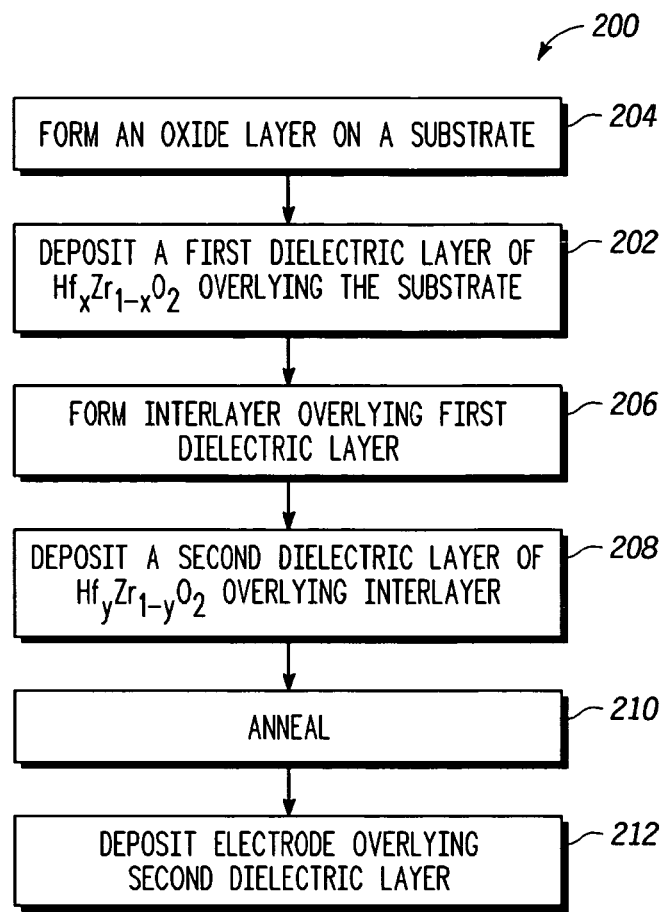
FIG. 6 is a flowchart of a process for fabricating a semiconductor structure in accordance with an exemplary embodiment of the present invention.

Referring now to FIG. 6, a process 200 for fabricating a semiconductor structure in accordance with an exemplary embodiment of the present invention will now be provided. The semiconductor structure may be a portion of a field effect transistor or may comprise any other suitable circuit. The process comprises the step 202 of depositing a first amorphous dielectric layer overlying a substrate. The substrate may comprise any of the materials described above for substrate 12 of FIG. 1. The first amorphous dielectric layer comprises an amorphous material having the formula $Hf_XZr_{1-X}O_2$, where $0 \leq X \leq 1$, and has a dielectric constant $k_1$ that is approximately no less than the dielectric constant of $HfZrO_4$. The first amorphous dielectric layer is deposited to any suitable thickness that is less than a thickness at which a polycrystalline phase may form.

In one optional embodiment of the invention, process 200 may include a step 204 of forming an oxide on the surface of the substrate before step 202 is performed. In one embodiment of the invention, the substrate may be exposed to oxygen or oxygen containing species to form the oxide. In another embodiment of the invention, an oxide layer may be deposited overlying the substrate.

After formation of the first amorphous dielectric layer, an interlayer is formed overlying the first amorphous dielectric layer (step 206). As described above, the interlayer may be formed of one layer or may be formed of multiple layers with different chemical compositions and, optionally, different thicknesses. The interlayer also may be formed so as to be "graded", as described above. The interlayer may comprise any amorphous dielectric material or materials that results in the interlayer having a net dielectric constant that is approximately no less than the dielectric constant of $HfZrO_4$. As described above, materials suitable for forming the interlayer include, but are not limited to, lanthanum aluminum oxide ($La_xAl_yO_3$), lanthanum scandium oxide ($La_xSc_yO_3$), lanthanum lutetium oxide ($La_xLu_yO_3$), strontium titanate ($Sr_xTi_yO_3$), barium titanate ($Ba_xTi_yO_3$), strontium barium titanate ($Sr_xBa_yTi_zO_3$), barium zirconium oxide ($Ba_xZr_yO_3$), strontium zirconium oxide ($Sr_xZr_yO_3$), and tantalum oxide ($Ta_2O_5$), where X, Y and Z are any numbers greater than zero. The interlayer is deposited to a thickness that is less than a thickness at which a polycrystalline phase may form.

Next, a second amorphous dielectric layer is deposited overlying the interlayer (step 208). The second amorphous dielectric layer comprises an amorphous material having the formula $Hf_yZr_{1-y}O_2$, where $0 \leq Y \leq 1$, and has a dielectric constant $k_2$ that is approximately no less than the dielectric constant of $HfZrO_4$. In one embodiment of the invention, the first and second amorphous dielectric layers are formed of different materials, that is, X does not equal Y and/or $k_1$ does not equal $k_2$. In another embodiment of the invention, the first and second amorphous dielectric layers are formed of the same materials, that is, X is approximately equal to Y and $k_1$ is approximately equal to $k_2$. In a preferred embodiment of the invention, the first amorphous dielectric layer and the second amorphous dielectric layer 22 comprise $HfO_2$. The second amorphous dielectric layer is deposited to any suitable thickness that is less than a thickness at which a polycrystalline phase may form.

The amorphous dielectric layers and the interlayers may be formed by any suitable process, such as molecular beam deposition (MBD), chemical vapor deposition (CVD), physical vapor deposition (PVD), ion beam deposition (IBD), atomic layer deposition (ALD), the like, or any combination thereof. Preferably, the layers are formed at temperatures from about 15° C. to about 350° C. After deposition of the second amorphous dielectric layer, the dielectric stack structure is subjected to an anneal at a temperature in the range of about 400° C. to about 700° C., preferably about 500° C., in an oxygen and/or nitrogen rich environment (step 210).

In one embodiment of the present invention, after the post-deposition anneal, an electrode layer may deposited overlying the second amorphous dielectric layer (step 212). The semiconductor structure then may be subjected to a high-temperature anneal at a temperature in the range of about 700° C. to about 1050° C., as is well known in the semiconductor industry. It will be appreciated that, if the semiconductor structure is a field effect transistor, a source region and a drain region may also be formed within the substrate. The source and/or drain regions may be formed before or after formation of the stacked dielectric structure.

In an optional embodiment of the present invention, after deposition of the second amorphous dielectric layer and before the anneal, a second interlayer may be formed overlying the second amorphous dielectric layer. The second interlayer may have a chemical composition that is the same as or different from the chemical composition of the first interlayer described above. Similarly, the second interlayer may have a thickness that is the same as or different from the thickness of the first interlayer. After deposition of the second interlayer, a third amorphous dielectric layer may be deposited. The third amorphous dielectric layer may have a chemical composition that is the same as or different from the chemical compositions of the first and/or second amorphous dielectric layers described above. Similarly, the third amorphous dielectric layer may have a thickness that is the same as or different from the thicknesses of the first and/or second amorphous dielectric layers. It will be appreciated that any suitable number of additional interlayers and additional amorphous dielectric layers subsequently may be deposited to form the dielectric stacked structure.

Accordingly, semiconductor structures and methods for forming semiconductor structures comprising amorphous stacked structures having high dielectric constants have been described. The amorphous stacked structures may fabricated with a thickness that minimizes or eliminates tunneling through stacked structure while also preventing or minimizing the formation of polycrystalline phases within stacked structure. In addition, the stacked structure exhibits an increased crystallization onset temperature, thus improving the stability and performance of the amorphous dielectric stack during subsequent anneal processes.

In summary, structures and methods configured in accordance with example embodiments of the invention relate to:

A stacked dielectric structure comprising: a first amorphous dielectric layer comprising $Hf_xZr_{1-x}O_2$, wherein $0 \leq X \leq 1$; a first amorphous interlayer overlying said first amorphous dielectric layer, said first interlayer having a net dielectric constant approximately no less than the dielectric constant of $HfZrO_4$; and a second amorphous dielectric layer overlying said first amorphous interlayer, said second amorphous dielectric layer comprising $Hf_yZr_{1-y}O_2$, where $0 \leq Y \leq 1$, wherein the stacked dielectric structure has a net dielectric constant that is approximately no less than the dielectric constant of $HfZrO_4$. The stacked dielectric structure further may comprise: a second amorphous interlayer overlying said second amorphous dielectric layer, said second amorphous interlayer having a net dielectric constant approximately no less than the dielectric constant of $HfZrO_4$; and a third amorphous dielectric layer overlying said second amorphous interlayer, said third amorphous dielectric layer comprising $Hf_NZr_{1-N}O_2$, where $0 \leq N \leq 1$. The first amorphous dielectric layer and the second amorphous dielectric layer of the stacked dielectric structure each further may comprise $HfO_2$. The first amorphous interlayer may comprise a material selected from the group consisting of lanthanum aluminum oxide ($La_xAl_yO_3$), lanthanum scandium oxide ($La_xSc_yO_3$), lanthanum lutetium oxide ($La_xLu_yO_3$), strontium titanate ($Sr_xTi_yO_3$), barium titanate ($Ba_xTi_yO_3$), strontium barium titanate ($Sr_xBa_yTi_zO_3$), barium zirconium oxide ($Ba_xZr_yO_3$), strontium zirconium oxide ($Sr_xZr_yO_3$), tantalum oxide ($Ta_2O_5$), and combinations thereof, wherein X, Y and Z are any numbers greater than zero. The first amorphous interlayer also may comprise a first sublayer and a second sublayer, wherein said first sublayer has a chemical composition that is different from a chemical composition of said second sublayer. The first sublayer further may have a thickness that is different from a thickness of said second sublayer. The stacked dielectric structure may have a thickness in the range of about 1 to about 10 nanometers.

A process for fabricating a transistor, the process comprising: depositing a first amorphous dielectric layer overlying a substrate, said first amorphous dielectric layer comprising $Hf_XZr_{1-X}O_2$, wherein $0 \leq X \leq 1$; forming an amorphous interlayer overlying said first amorphous dielectric layer, said amorphous interlayer having a net dielectric constant approximately no less than the dielectric constant of $HfZrO_4$; and depositing a second amorphous dielectric layer overlying said amorphous interlayer to form a stacked dielectric structure, said second amorphous dielectric layer comprising $Hf_YZr_{1-Y}O_2$, where $0 \leq Y \leq 1$, wherein the stacked dielectric structure has a net dielectric constant that is approximately no less than the dielectric constant of $HfZrO_4$; and forming a source region and a drain region within said substrate. The process further may comprise: forming a second amorphous interlayer overlying said second amorphous dielectric layer, said second amorphous interlayer having a net dielectric constant approximately no less than the dielectric constant of $HfZrO_4$; and depositing a third amorphous dielectric layer overlying said second amorphous interlayer, said third amorphous dielectric layer comprising $Hf_NZr_{1-N}O_2$, wherein $0 \leq N \leq 1$. The step of depositing a first amorphous dielectric layer may comprise the step of depositing a first amorphous layer of $HfO_2$. The step of forming said first amorphous interlayer may comprise the step of depositing a material selected from the group consisting of lanthanum aluminum oxide ($La_XAl_YO_3$), lanthanum scandium oxide ($La_XSc_YO_3$), lanthanum lutetium oxide ($La_XLu_YO_3$), strontium titanate ($Sr_XTi_YO_3$), barium titanate ($Ba_XTi_YO_3$), strontium barium titanate ($Sr_XBa_YTi_ZO_3$), tantalum oxide ($Ta_2O_5$), barium zirconium oxide ($Ba_XZr_YO_3$), strontium zirconium oxide ($Sr_XZr_YO_3$), and combinations thereof, wherein X, Y and Z are any numbers greater than zero. The step of forming said first amorphous interlayer may comprise: forming a first sublayer having a first chemical composition; and forming a second sublayer having a second chemical composition that is different from said first chemical composition. The step of forming said first amorphous interlayer also may comprise: forming said first sublayer having a first thickness; and forming said second sublayer having a second thickness that is different from said first thickness. The step of forming said first amorphous interlayer may comprise forming said first amorphous interlayer so that said first amorphous interlayer has a chemical composition at a first surface of said amorphous interlayer that is different from a chemical composition at a second surface. The steps of depositing a first amorphous dielectric layer, forming an amorphous interlayer, and depositing a second amorphous dielectric layer may be performed so that the stacked dielectric structure has a thickness in the range of about 1 to about 10 nanometers.

A method for modifying a work function of a gate structure of a transistor, the method comprising: forming a layer of $SiO_X$ overlying a silicon substrate, where X is any number greater than zero; depositing a first amorphous dielectric layer of material comprising $Hf_YZr_{1-Y}O_2$ overlying said layer of $SiO_X$, where $0 \leq Y \leq 1$; forming an amorphous interlayer overlying said first amorphous dielectric layer, wherein said amorphous interlayer has a net dielectric constant approximately no less than the dielectric constant of $HfZrO_4$ and wherein said amorphous interlayer has a chemical composition at a first surface of said amorphous interlayer that is different from a chemical composition at a second surface of said amorphous interlayer; depositing a second amorphous dielectric layer of material comprising $Hf_ZZr_{1-Z}O_2$ overlying said amorphous interlayer, where $0 \leq Z \leq 1$; and depositing a metal layer overlying said second amorphous dielectric layer. The step of depositing said first amorphous dielectric layer may comprise the step of depositing a first amorphous layer of $HfO_2$. The step of forming said amorphous interlayer may comprise the step of depositing a material selected from the group consisting of lanthanum aluminum oxide ($La_XAl_YO_3$), lanthanum scandium oxide ($La_XSc_YO_3$), lanthanum lutetium oxide ($La_XLu_YO_3$), strontium titanate ($Sr_XTi_YO_3$), barium titanate ($Ba_XTi_YO_3$), strontium barium titanate ($Sr_XBa_YTi_ZO_3$), barium zirconium oxide ($Ba_XZr_YO_3$), strontium zirconium oxide ($Sr_XZr_YO_3$), and combinations thereof, wherein X, Y and Z are any numbers greater than zero. The step of forming said amorphous interlayer may comprise: forming a first sublayer having a first chemical composition; and forming a second sublayer having a second chemical composition that is different from said first chemical composition. The step of forming said amorphous interlayer also may comprise: forming said first sublayer having a first thickness; and forming said second sublayer having a second thickness that is different from said first thickness.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A process for fabricating a transistor, the process comprising:
   depositing a first amorphous dielectric layer overlying a substrate, said first amorphous dielectric layer comprising $Hf_XZr_{i-X}O_2$, wherein $0 \leq X \leq 1$;
   forming an amorphous interlayer overlying said first amorphous dielectric layer, said amorphous interlayer having a net dielectric constant approximately no less than the dielectric constant of $HfZrO_4$, wherein said amorphous interlayer is formed such that a chemical composition at a first surface of said amorphous interlayer is different from a chemical composition at a second surface of said amorphous interlayer;
   depositing a second amorphous dielectric layer overlying said amorphous interlayer to form a stacked dielectric structure, said second amorphous dielectric layer comprising $HfZr_{1-Y}O_2$, where $0 \leq Y \leq 1$, wherein the stacked dielectric structure has a net dielectric constant that is approximately no less than the dielectric constant of $HfZrO_4$;
   forming a source region within said substrate; and
   forming a drain region within said substrate.

2. The process for fabricating a transistor of claim 1, the process further comprising:

forming a second amorphous interlayer overlying said second amorphous dielectric layer, said second amorphous interlayer having a net dielectric constant approximately no less than the dielectric constant of $HfArO_4$; and depositing a third amorphous dielectric layer overlying said second amorphous interlayer, said third amorphous dielectric layer comprising $Hf_N Zr_{1-N} O_2$, wherein $0 \leq N \leq 1$.

3. The process for fabricating a transistor of claim 1, wherein the step of depositing a first amorphous dielectric layer comprises the step of depositing a first amorphous layer of $HfO_2$.

4. The process for fabricating a transistor of claim 1, wherein the step of forming said first amorphous interlayer comprises the step of depositing a material selected from the group consisting of lanthanum aluminum oxide ($La_X Al_Y O_3$), lanthanum scandium oxide ($La_X Sc_Y O_3$), lanthanum lutetium oxide ($La_{XLu Y} O_3$), strontium titanate ($Sr_X Ti_Y O_3$), barium titanate ($Ba_X Ti_Y O_3$), strontium barium titanate ($Sr_X Ba_Y Ti_Z O_3$), tantalum oxide ($Ta_2 O_5$), barium zirconium oxide ($Ba_X Zr_Y O_3$), strontium zirconium oxide ($Sr_X Zr_Y O_3$), and combinations thereof, wherein X, Y and Z are any numbers greater than zero.

5. The process for fabricating a transistor of claim 1, wherein the step of forming said first amorphous interlayer comprises:

forming a first sublayer having a first chemical composition; and forming a second sublayer having a second chemical composition that is different from said first chemical composition.

6. The process for fabricating a transistor of claim 5, wherein the step of forming said first amorphous interlayer comprises:

forming said first sublayer having a first thickness; and forming said second sublayer having a second thickness that is different from said first thickness.

7. The process for fabricating a transistor of claim 1, wherein the step of forming said first amorphous interlayer comprises forming said first amorphous interlayer so that said first amorphous interlayer has a chemical composition at a first surface of said amorphous interlayer that is different from a chemical composition at a second surface.

8. The process for fabricating a transistor of claim 1, wherein the steps of depositing a first amorphous dielectric layer, forming an amorphous interlayer, and depositing a second amorphous dielectric layer are performed so that the stacked dielectric structure has a thickness in the range of about 1 to about 10 nanometers.

9. A method for modifying a work function of a gate structure of a transistor, the method comprising:

forming a layer of $SiO_X$ overlying a silicon substrate, where X is any number greater than zero;

depositing a first amorphous dielectric layer of material comprising $Hf_Y Zr_{1-Y} O_2$ overlying said layer of $SiO_X$, where $0 \leq Y \leq 1$;

forming an amorphous interlayer overlying said first amorphous dielectric layer, wherein said amorphous interlayer has a net dielectric constant approximately no less than the dielectric constant of $HfArO_4$ and wherein said amorphous interlayer has a chemical composition at a first sin-face of said amorphous interlayer that is different from a chemical composition at a second surface of said amorphous interlayer;

depositing a second amorphous dielectric layer of material comprising $Hf_Z Zr_{1-Z} O_2$ overlying said amorphous interlayer, where $0 \leq Z \leq 1$; and depositing a metal layer overlying said second amorphous dielectric layer.

10. The method for modifying a work function of a gate structure of a transistor of claim 9, wherein the step of depositing said first amorphous dielectric layer comprises the step of depositing a first amorphous layer of $HfO_2$.

11. The method for modifying a work function of a gate structure of a transistor of claim 9, wherein the step of forming said amorphous interlayer comprises the step of depositing a material selected from the group consisting of lanthanum aluminum oxide ($La_X Al_Y O_3$), lanthanum scandium oxide ($La_X Sc_Y O_3$), lanthanum lutetium oxide ($La_X Lu_Y O_3$), strontium titanate ($Sr_X Ti_Y O_3$), barium titanate ($Ba_X Ti_Y O_3$), strontium barium titanate ($Sr_X Ba_Y Ti_Z O_4$ barium zirconium oxide ($Ba_X Zr_Y O_3$), strontium zirconium oxide ($Sr_X Zr_Y O_3$), and combinations thereof, wherein X, Y and Z are any numbers greater than zero.

12. The method for modifying a work function of a gate structure of a transistor of claim 9, wherein the step of fanning said amorphous interlayer comprises:

forming a first sublayer having a first chemical composition; and forming a second sublayer having a second chemical composition that is different from said first chemical composition.

13. The method for modifying a work function of a gate structure of a transistor of claim 12, wherein the step of forming said amorphous interlayer comprises:

forming said first sublayer having a first thickness; and forming said second sublayer having a second thickness that is different from said first thickness.

* * * * *

UNITED STATES PATENT AND TRADEMARK OFFICE
CERTIFICATE OF CORRECTION

| | | |
|---|---|---|
| PATENT NO. | : 7,217,643 B2 | Page 1 of 1 |
| APPLICATION NO. | : 11/066887 | |
| DATED | : May 15, 2007 | |
| INVENTOR(S) | : Yong Liang et al. | |

It is certified that error appears in the above-identified patent and that said Letters Patent is hereby corrected as shown below:

Title Page, Item (57) Abstract line 6, the mathematical formula shoud appear as follows:
$0 \leq X \leq 1$ Title Page, Item (57) Abstract line 12, the mathematical formula should appear as follows:
$0 \leq Y \leq 1$ Column 10, line 48, the mathematical formula should appear as follows: $0 \leq X \leq 1$ Column 10, line 60, the mathematical formula should appear as follows: $0 \leq Y \leq 1$ Column 11, line 9, the mathematical formula should appear as follows: $0 \leq N \leq 1$ Column 12, line 5, the mathematical formula should appear as follows: $0 \leq Y \leq 1$ Column 12, line 17, the mathematical formula should appear as follows: $0 \leq Z \leq 1$ Signed and Sealed this Seventeenth Day of July, 2007

JON W. DUDAS
*Director of the United States Patent and Trademark Office*